United States Patent
Hirao et al.

(10) Patent No.: US 8,018,255 B2
(45) Date of Patent: Sep. 13, 2011

(54) DC-DC CONVERTER, DRIVER IC, AND SYSTEM IN PACKAGE

(75) Inventors: Takashi Hirao, Hitachi (JP); Takayuki Hashimoto, Tokai (JP); Masaki Shiraishi, Hitachinaka (JP)

(73) Assignee: Renesas Electronics Corporation, Kanagawa (JP)

( * ) Notice: Subject to any disclaimer, the term of this patent is extended or adjusted under 35 U.S.C. 154(b) by 491 days.

(21) Appl. No.: 12/171,347

(22) Filed: Jul. 11, 2008

(65) Prior Publication Data

US 2009/0015224 A1    Jan. 15, 2009

(30) Foreign Application Priority Data

Jul. 12, 2007   (JP) .................................. 2007-182743

(51) Int. Cl.
*H03K 3/00*    (2006.01)

(52) U.S. Cl. ..................... 327/108; 327/111; 257/288

(58) Field of Classification Search .............. 363/16–20, 363/37, 59, 60, 62; 323/224, 225, 258, 259, 323/271, 282, 284, 222; 327/108, 109, 111; 257/288, 357

See application file for complete search history.

(56) References Cited

U.S. PATENT DOCUMENTS

| | | | |
|---|---|---|---|
| 7,005,834 B2 | 2/2006 | Iwasaki et al. | |
| 7,782,098 B2 * | 8/2010 | Hashimoto et al. | ........... 327/108 |
| 2006/0006432 A1 * | 1/2006 | Shiraishi et al. | .............. 257/288 |
| 2007/0195563 A1 | 8/2007 | Shiraishi et al. | |
| 2007/0200537 A1 | 8/2007 | Akiyama et al. | |

FOREIGN PATENT DOCUMENTS

| | | |
|---|---|---|
| JP | 8-149796 | 6/1996 |
| JP | 11-146640 | 5/1999 |
| JP | 2005-027417 | 1/2005 |
| JP | 2006-25567 | 1/2006 |
| JP | 2007-227763 | 9/2007 |
| JP | 2007-228711 | 9/2007 |

* cited by examiner

*Primary Examiner* — Rajnikant B Patel
(74) *Attorney, Agent, or Firm* — Mattingly & Malur, PC

(57) ABSTRACT

A DC-DC converter in which self turn-on can be prevented and can improve power efficiency. In a non-insulated DC-DC converter, self turn-on is prevented by applying a negative voltage between a gate and a source of a low side MOSFET by the use of a capacitor for generating negative voltage when the low side MOSFET is in an OFF state. Also, when the low side MOSFET is in an ON state due to the capacitor for generating negative voltage, a positive voltage applied between the gate and the source of the low side MOSFET does not drop from a voltage of a gate driving DC power source that is supplied from a gate power input terminal. Therefore, the power efficiency is improved.

7 Claims, 10 Drawing Sheets

US 8,018,255 B2

DC-DC CONVERTER, DRIVER IC, AND SYSTEM IN PACKAGE

CROSS-REFERENCE TO RELATED APPLICATION

The present application claims priority from Japanese Patent Application No. JP 2007-182743 filed on Jul. 12, 2007, the content of which is hereby incorporated by reference into this application.

TECHNICAL FIELD OF THE INVENTION

The present invention relates to a DC-DC converter in a power supply system, a driver IC in the DC-DC converter, and a system in package (SiP) in the DC-DC converter. More particularly, it relates to a technology for improving the power efficiency thereof.

BACKGROUND OF THE INVENTION

According to the study carried out by the inventors of the present invention, with regard to a DC-DC converter, the technology as follows has been known.

In recent years, along with the increasing demands for low voltage and high current for a CPU (Central Processor Unit) and a MPU (Micro Processor Unit) that are used in a personal computer, a server and the like and downsizing of passive components such as a choke coil and an input/output capacitor, higher efficiency and higher frequency are required for a power supply system that supplies power to the CPU and the MPU.

A non-insulated DC-DC converter for such a system comprises a high side switch and a low side switch, and power MOSFETs (Metal Oxide Semiconductor Field Effect Transistor) are used for each of the switches.

However, in the non-insulated DC-DC converter, a self turn-on phenomenon sometimes occurs in which turn-on of the high side MOSFET causes erroneous turn-on of the low side MOSFET. This self turn-on phenomenon gives rise to a problem of significant reduction in power efficiency.

For prevention of the self turn-on, it is effective to apply a sufficient negative voltage between a gate and a source of the low side MOSFET in a period when the low side MOSFET is in an OFF state. More specifically, by applying a sufficient negative voltage between the gate and the source of the low side MOSFET, the gate-source voltage of the low side MOSFET does not reach a gate threshold voltage of the low side MOSFET even when the increase in the gate-source voltage that induces the self turn-on occurs.

However, a DC voltage source whose negative terminal is connected to a source terminal of the low side MOSFET is used in general for a power source for a gate driver of a non-insulated DC-DC converter having a small power capacity, and a negative voltage cannot be applied between the gate and the source of the low side MOSFET.

As a solution for such a problem, for example, Japanese Patent Application Laid-Open Publication No. 8-149796 (Patent document 1) discloses means for applying a negative voltage between a gate and a source of a voltage controlled device by a gate driver to which a capacitor is added.

SUMMARY OF THE INVENTION

Incidentally, the inventors of the present invention have found out that Patent document 1 has the following problems.

For example, in Patent document 1, since a voltage corresponding to a negative voltage applied between the gate and the source of the voltage controlled device is charged to the capacitor, a positive voltage applied between the gate and the source of the voltage controlled device is reduced by that voltage charged to the capacitor in an ON period of the voltage controlled device.

The reduction in the positive voltage applied in the ON period of the voltage controlled device causes an increase of the conduction loss of the voltage controlled device, and the power efficiency is disadvantageously decreased.

Accordingly, an object of the present invention is to provide a DC-DC converter capable of preventing the self turn-on and improving the power efficiency.

The above and other objects and novel characteristics of the present invention will be apparent from the description of this specification and the accompanying drawings.

Typical embodiments of the invention disclosed in this application will be briefly described as follows.

A non-insulated DC-DC converter according to the present invention is a non-insulated DC-DC converter comprising: a choke coil; an output capacitor connected between one end of the choke coil and a negative terminal of a DC input power source; a high side MOSFET whose drain terminal is connected to a positive terminal of the DC input power source and whose source terminal is connected to the other end of the choke coil; a low side MOSFET whose drain terminal is connected to the other end of the choke coil and whose source terminal is connected to the negative terminal of the DC input power source; and a gate driver controlled in accordance with a pulse signal and alternately driving the high side MOSFET and the low side MOSFET, wherein a part of the gate driver, the part driving the low side MOSFET, includes: a gate driving DC power source whose negative terminal is connected to the source terminal of the low side MOSFET; a capacitor for generating negative voltage; a first switching element connected between a positive terminal of the gate driving DC power source and a gate terminal of the low side MOSFET; a second switching element connected between the positive terminal of the gate driving DC power source and one end of the capacitor for generating negative voltage; a third switching element connected between the gate terminal of the low side MOSFET and the other end of the capacitor for generating negative voltage; a fourth switching element connected between the one end of the capacitor for generating negative voltage and the source terminal of the low side MOSFET; and a fifth switching element connected between the other end of the capacitor for generating negative voltage and the source terminal of the low side MOSFET.

Also, a driver IC according to the present invention is a driver IC to which a capacitor for generating negative voltage and a gate driving DC power source are connected and which is controlled in accordance with a pulse signal and alternately drives a high side MOSFET and a low side MOSFET, wherein a first switching element connected between a positive terminal of the gate driving DC power source and a gate terminal of the low side MOSFET; a second switching element connected between the positive terminal of the gate driving DC power source and one end of the capacitor for generating negative voltage; a third switching element connected between the gate terminal of the low side MOSFET and the other end of the capacitor for generating negative voltage; a fourth switching element connected between the one end of the capacitor for generating negative voltage and a source terminal of the low side MOSFET; a fifth switching element connected between the other end of the capacitor for generating negative voltage and the source terminal of the low side MOSFET; and a diode connected to the fifth switching element in series are formed on the same chip.

Also, a system in package according to the present invention is a system in package in which a high side MOSFET, a low side MOSFET, and a driver IC which alternately drives the high side MOSFET and the low side MOSFET are mounted in the same package, wherein a first switching element connected between a positive terminal of a gate driving DC power source connected to the system in package and a gate terminal of the low side MOSFET; a second switching element connected between the positive terminal of the gate driving DC power source and one end of a capacitor for generating negative voltage connected to the system in package; a third switching element connected between the gate terminal of the low side MOSFET and the other end of the capacitor for generating negative voltage; a fourth switching element connected between the one end of the capacitor for generating negative voltage and a source terminal of the low side MOSFET; a fifth switching element connected between the other end of the capacitor for generating negative voltage and the source terminal of the low side MOSFET; and a diode connected to the fifth switching element in series are formed on the same chip of the driver IC.

The effects obtained by typical aspects of the present invention will be briefly described below.
(1) In a non-insulated DC-DC converter, the self turn-on can be prevented without an increase in conduction loss.
(2) As a result of (1), the power efficiency can be improved.

BRIEF DESCRIPTIONS OF THE DRAWINGS

DESCRIPTIONS OF THE PREFERRED EMBODIMENTS

Hereinafter, embodiments of the present invention will be described in detail with reference to the accompanying drawings. Note that components having the same function are denoted by the same reference numbers throughout the drawings for describing the embodiments, and the repetitive description thereof will be omitted. Further, the repetitive description of the conventional technology examined as a premise of the present invention will also be omitted similarly.

First Embodiment

Figure 1:
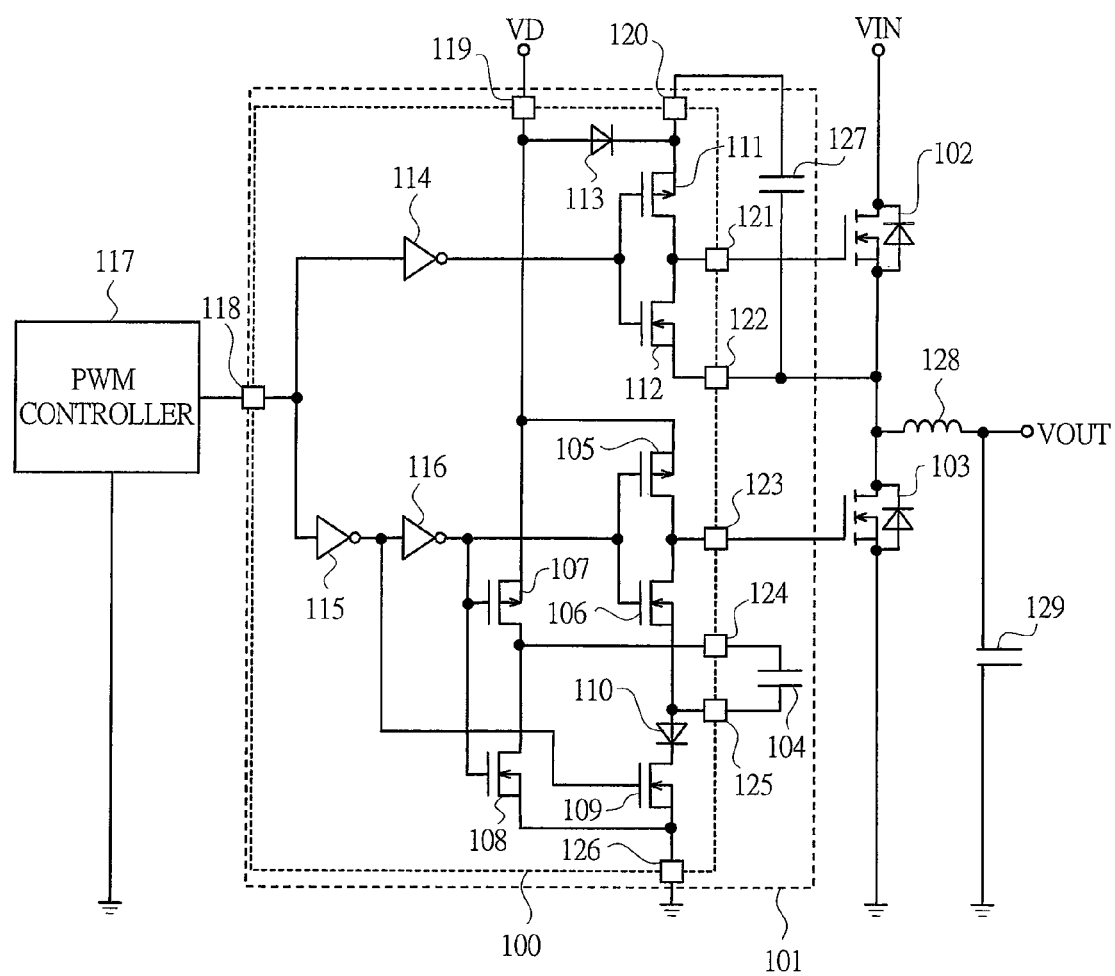
FIG. 1 is a diagram showing an example of a circuit configuration of a DC-DC converter according to a first embodiment of the present invention.
Figure 2:
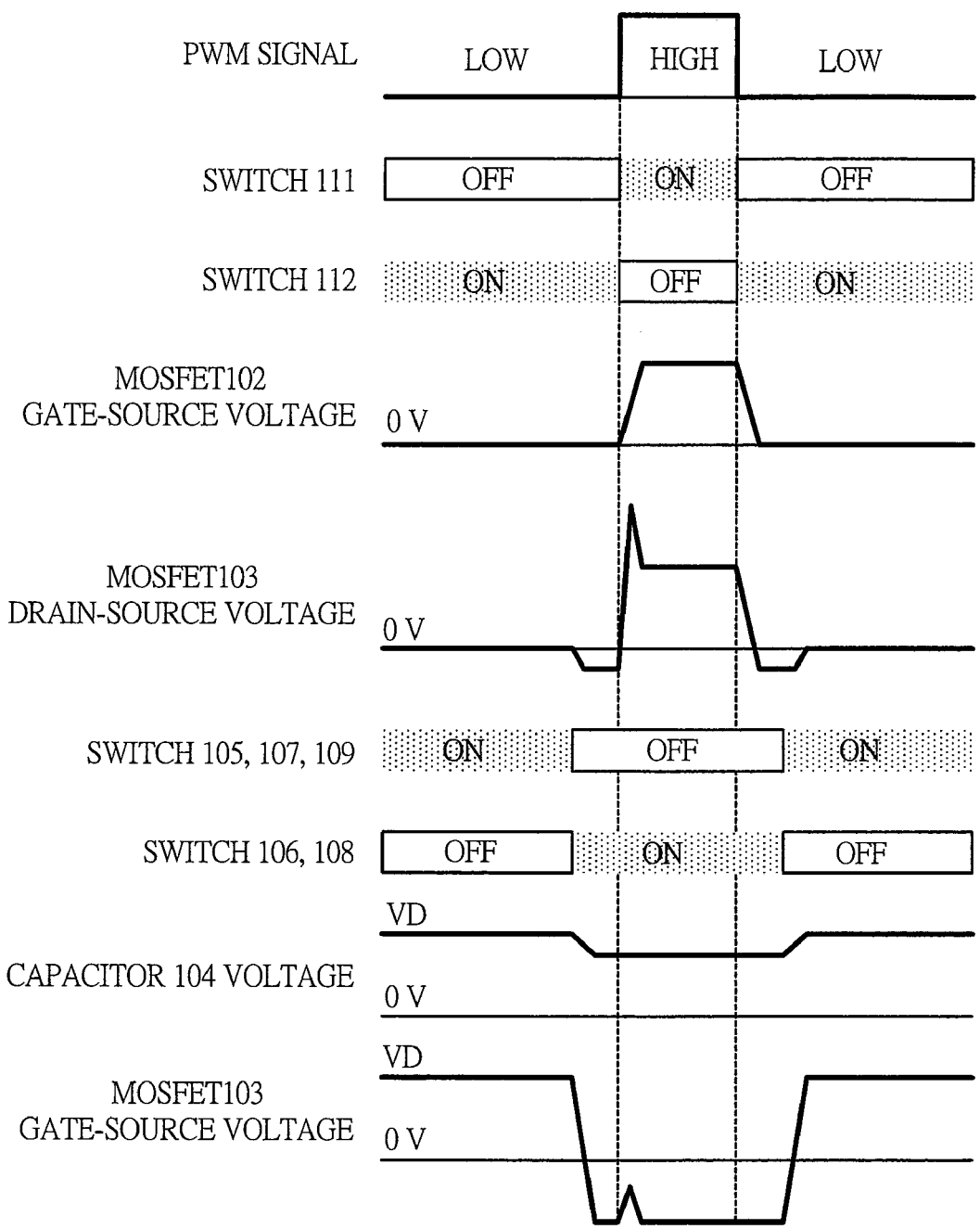
FIG. 2 is a timing chart of a signal, each switch, and each voltage of the DC-DC converter according to the first embodiment of the present invention.
Figure 3:
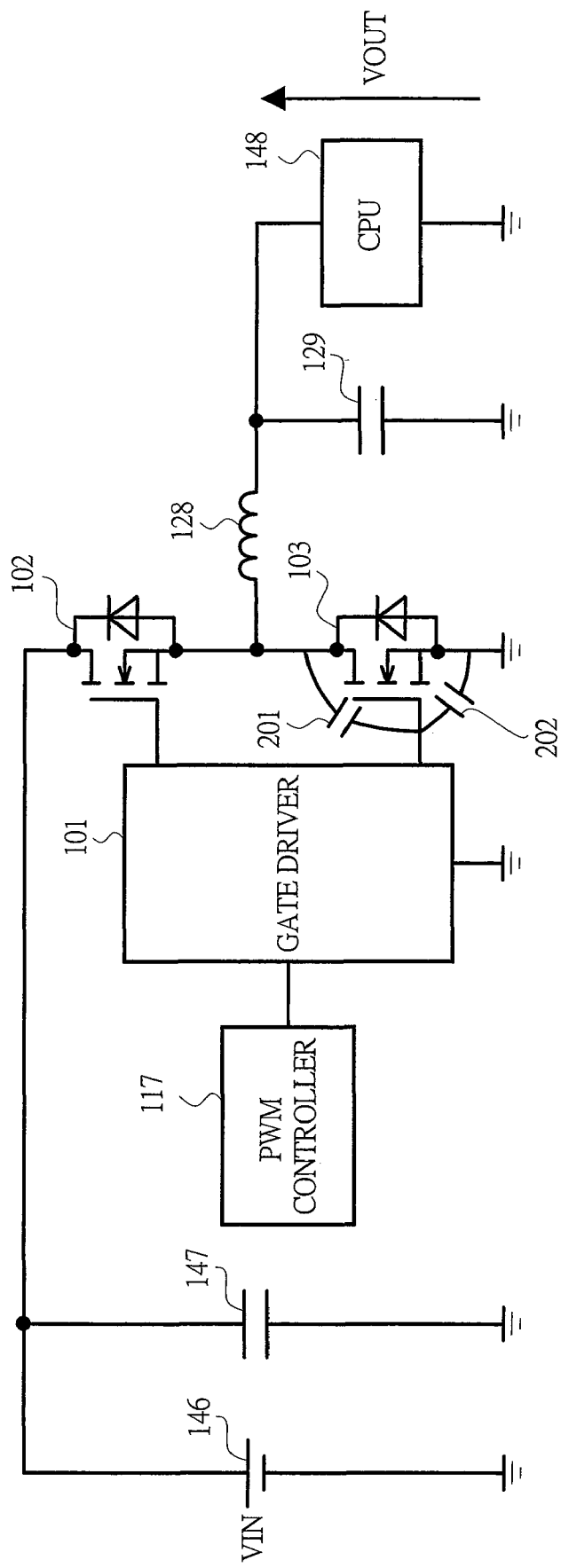
FIG. 3 is a diagram showing an example of a configuration of a power supply system for a CPU including the DC-DC converter according to the first embodiment of the present invention.
Figure 4:
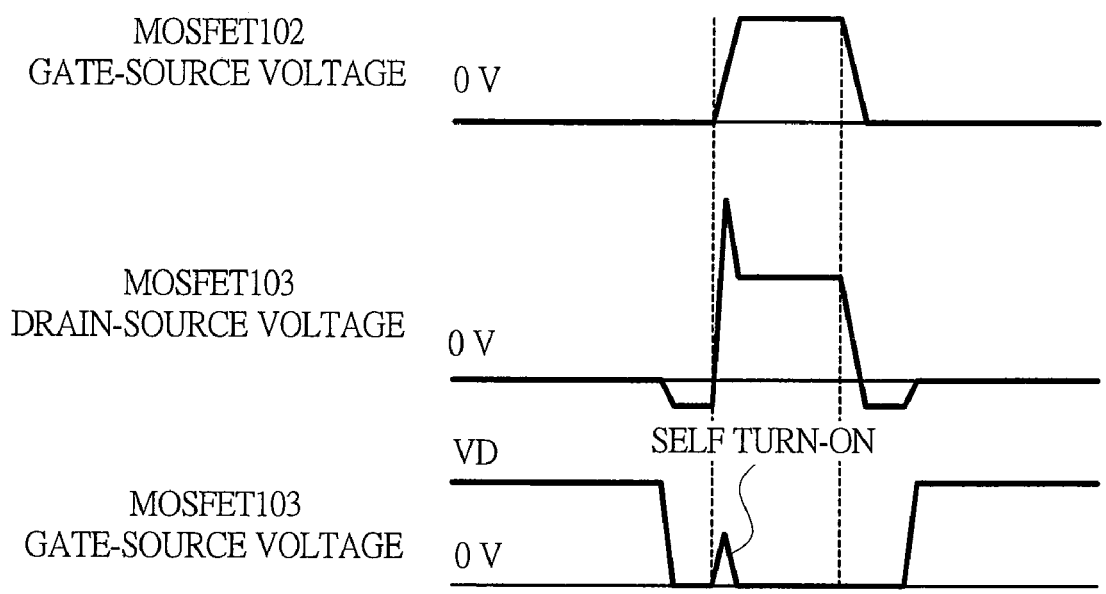
FIG. 4 is a timing chart of each voltage for describing a self turn-on phenomenon of the DC-DC converter according to the first embodiment of the present invention.
Figure 5:
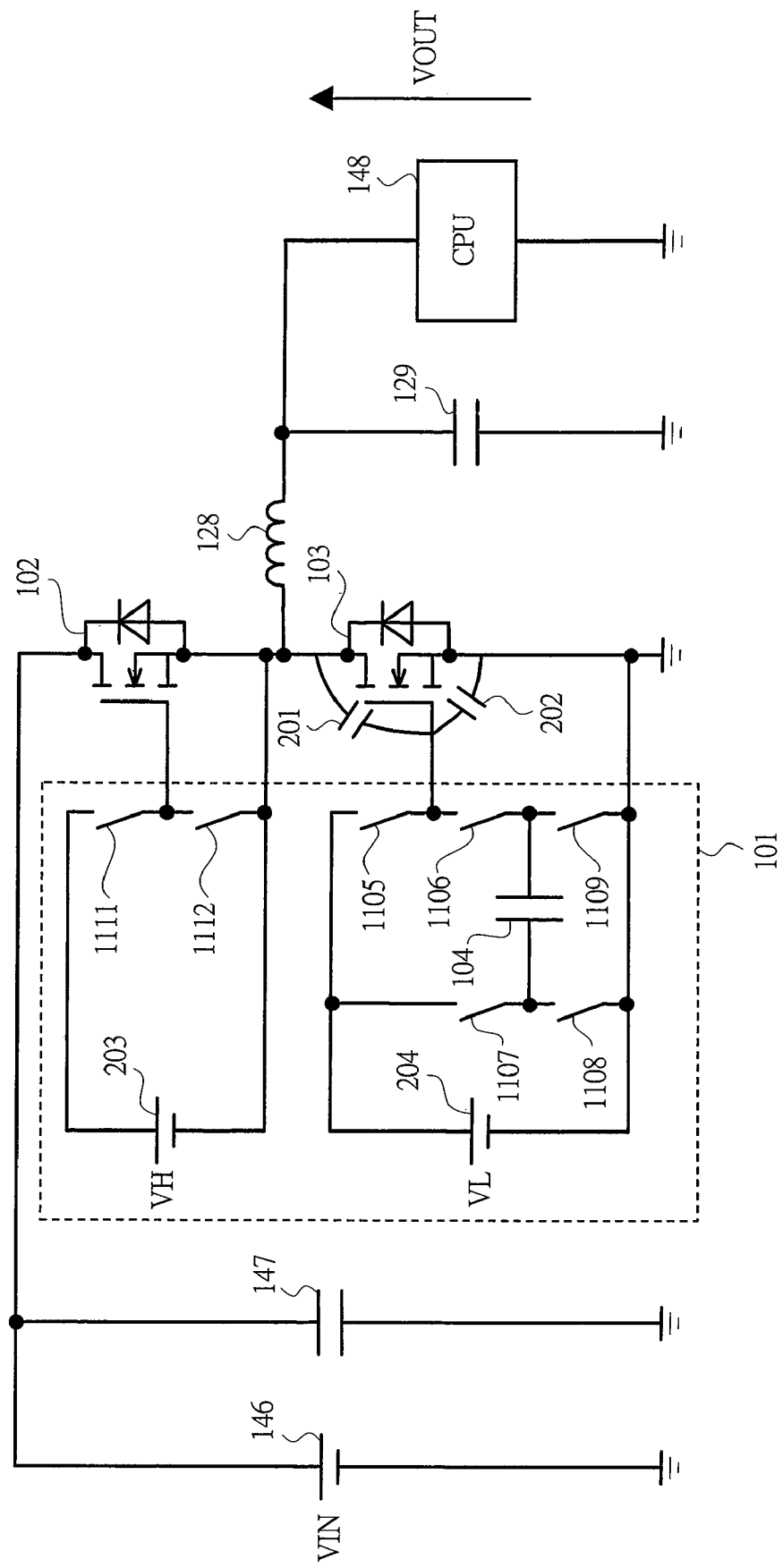
FIG. 5 is a diagram showing a circuit configuration for describing operation principles of the DC-DC converter according to the first embodiment of the present invention.
Figure 6:
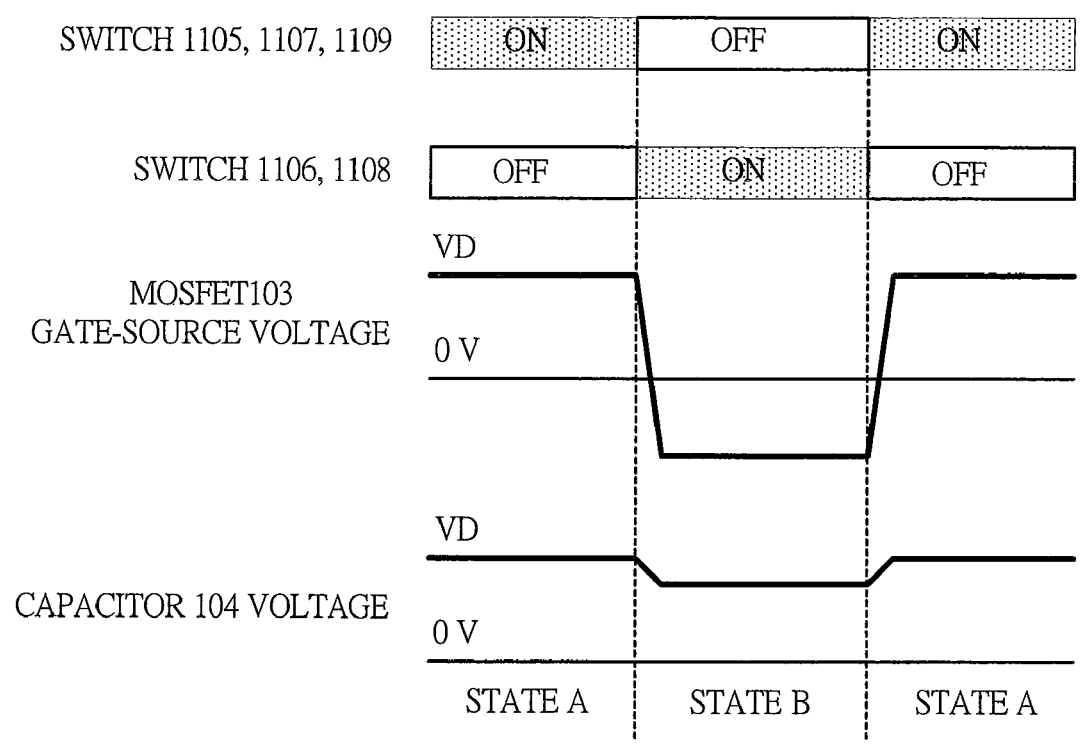
FIG. 6 is a timing chart of a signal, each switch, and each voltage for describing a negative voltage application operation of a gate driver of the DC-DC converter according to the first embodiment of the present invention.

A circuit configuration and an operation of a DC-DC converter according to a first embodiment of the present invention will be described with reference to FIG. 1 to FIG. 6. FIG. 1 is a diagram showing an example of the circuit configuration of the DC-DC converter according to the first embodiment of the present invention. Note that FIG. 1 is a simplified diagram, and a circuit that realizes a function to prevent simultaneous turn-on is not illustrated therein. FIG. 2 is a timing chart of a signal, each switch, and each voltage of the DC-DC converter according to the first embodiment of the present invention. FIG. 3 is a diagram showing an example of a configuration of a power supply system for a CPU including the DC-DC converter according to the first embodiment of the present invention. FIG. 4 is a timing chart of each voltage for describing a self turn-on phenomenon of the DC-DC converter according to the first embodiment of the present invention. FIG. 5 is a diagram showing circuit configuration for describing operation principles of the DC-DC converter according to the first embodiment of the present invention. FIG. 6 is a timing chart of a signal, each switch, and each voltage for describing a negative voltage application operation of a gate driver of the DC-DC converter according to the first embodiment of the present invention.

In FIG. 1, the DC-DC converter comprises a high side MOSFET 102, a low side MOSFET 103, a gate driving unit 100 that drives the high side MOSFET 102 and the low side MOSFET 103, a boot capacitor 127, a choke coil 128, an output capacitor 129, and a PWM (Pulse Width Modulation) controller 117.

Also, both a source terminal of the low side MOSFET 103 and a ground terminal 126 of the gate driving unit 100 are connected to ground.

Further, the gate driving unit 100 is a semiconductor chip, and p channel MOSFETs 105, 107 and 111, n channel MOSFETs 106, 108, 109 and 112, a diode 110 that is connected to the n channel MOSFET 109 in series and blocks a reverse current, a boot diode 113, and NOT gates 114, 115 and 116 are formed on the same chip. This semiconductor chip constitutes a driver IC of the DC-DC converter.

Also, a capacitor for generating negative voltage 104 is connected to terminals 124 and 125 of the gate driving unit 100. For example, when an input capacitance of the low side MOSFET 103 is about 3000 pF, for example, 0.1 μF is used as a capacitance of the capacitor for generating negative voltage 104.

The gate driving unit 100, the capacitor for generating negative voltage 104 and the boot capacitor 127 constitute a gate driver 101.

In FIG. 3, the power supply system for the CPU 148 including the DC-DC converter comprises the high side MOSFET 102, the low side MOSFET 103, the gate driver 101 that drives the high side MOSFET 102 and the low side MOSFET 103, the PWM controller 117 that controls the gate driver 101, an input power source 146, an input capacitor 147, the choke coil 128, the output capacitor 129 and others. Also, both the source terminal of the low side MOSFET 103 and the ground terminal 126 of the gate driver 101 are connected to ground.

Here, a self turn-on phenomenon of the DC-DC converter according to the first embodiment of the present invention will be described with reference to FIG. 3 and FIG. 4.

The gate driver 101 drives the high side MOSFET 102 and the low side MOSFET 103 in synchronization with a PWM signal from the PWM controller 117 so that the high side MOSFET 102 and the low side MOSFET 103 are alternately turned on.

An output voltage VOUT has a voltage value obtained by multiplying an input voltage VIN by an on-time ratio (proportion of an ON period in one switching cycle) of the high side MOSFET 102 and step-down conversion takes place. The low side MOSFET 103 is turned on when the high side MOSFET 102 is OFF, so that a current flowing through the choke coil 128 flows back.

However, when the high side MOSFET 102 is turned on in a state where the low side MOSFET 103 is OFF, a drain-source voltage of the low side MOSFET 103 increases, and in response to the voltage change, a phenomenon occurs in which a charging current flows between the gate and the source of the low side MOSFET 103 via a Miller capacitance 201 placed between the gate and the drain of the low side MOSFET 103, and the gate-source voltage of the low side MOSFET 103 increases.

At this time, if the gate-source voltage of the low side MOSFET 103 exceeds a gate threshold voltage thereof, the low side MOSFET 103 is turned on, a high shoot-through current flows from the high side MOSFET 102 to the low side MOSFET 103 (self turn-on phenomenon), and the power efficiency is significantly decreased.

Hence, in the present embodiment, a negative voltage is applied between the gate and the source of the low side MOSFET 103 in a period when the low side MOSFET 103 is OFF, and moreover, a positive voltage applied between the gate and the source of the low side MOSFET 103 is not allowed to drop from a voltage value of a gate driving DC power source VD in a period when the low side MOSFET 103 is ON.

Next, the operation principles of the DC-DC converter according to the first embodiment of the present invention will be described with reference to FIG. 5 and FIG. 6.

The gate driver 101 that drives the high side MOSFET 102 and the low side MOSFET 103 of the DC-DC converter shown in FIG. 5 comprises switches 1105, 1106, 1107, 1108, 1109, 1111 and 1112 and gate driving DC power sources 203 and 204. However, the switches 1105, 1106, 1107, 1108, 1109, 1111 and 1112 shown in FIG. 5 are illustrated as ideal switches, and an illustration of a PWM controller for controlling these switches is omitted.

In a state A shown in FIG. 6, the switch 1105 is ON, VD is applied as a positive voltage between the gate and the source of the low side MOSFET 103, and the low side MOSFET 103 is in an ON state. At this time, each of the switches 1107 and 1109 is also ON, each of the switches 1106 and 1108 is OFF, and the capacitor for generating negative voltage 104 is charged up to VD.

When the state A changes to a state B in FIG. 6, each of the switches 1105, 1107 and 1109 is turned off, each of the switches 1106 and 1108 is turned on, the voltage of the capacitor for generating negative voltage 104 is applied as a negative voltage between the gate and the source of the low side MOSFET 103, and the low side MOSFET 103 is turned off.

Accordingly, in the present embodiment, the negative voltage is applied between the gate and the source of the low side MOSFET 103 when the low side MOSFET 103 is in an OFF period (state B). Therefore, even when the gate-source voltage of the low side MOSFET 103 increases, the voltage does not reach the gate threshold voltage of the low side MOSFET 103. As a result, the self turn-on can be prevented.

Also, there is a fear that the voltage applied between the drain and the source of the low side MOSFET 103 drops in the ON period (state A) of the low side MOSFET 103 due to the charging to the capacitor for generating negative voltage 104. However, since a charging path of the capacitor for generating negative voltage 104 is provided separately from a charging path of input capacitance (capacitor 202 in FIGS. 3 and 5) of the low side MOSFET 103, a drop of the voltage applied between the drain and the source of the low side MOSFET 103 does not occur in the ON period of the low side MOSFET 103.

Next, a detailed operation of the DC-DC converter according to the first embodiment of the present invention will be described with reference to FIG. 1 and FIG. 2.

The gate driver 101 drives the high side MOSFET 102 and the low side MOSFET 103 in synchronization with a PWM signal from the PWM controller 117.

However, when the high side MOSFET 102 is turned on in a state where the low side MOSFET 103 is OFF as described above, a phenomenon occurs in which the gate-source voltage of the low side MOSFET 103 increases. At this time, if the gate-source voltage of the low side MOSFET 103 exceeds the gate threshold voltage thereof, the self turn-on phenomenon described above occurs, and the power efficiency is significantly decreased.

Hence, the DC-DC converter of the present embodiment has a configuration in which the capacitor for generating negative voltage 104 is connected to the gate driving unit 100, and the gate driving DC power source VD is connected to a gate power source input terminal 119, whereby a positive voltage or a negative voltage is applied between the gate and the source of the low side MOSFET 103 in accordance with timing of the PWM signal, and further, the positive voltage applied between the gate and the source of the low side MOSFET 103 does not drop from the voltage value of the gate driving DC power source VD.

When the level of the PWM signal is low, the p channel MOSFET 105 is ON, VD is applied as a positive voltage between the gate and the source of the low side MOSFET 103, and the low side MOSFET 103 is in an ON state. At this time, the p channel MOSFET 107 and the n channel MOSFET 109 are also ON, the n channel MOSFETs 106 and 108 are OFF, and the capacitor for generating negative voltage 104 is charged up to VD.

When the level of the PWM signal becomes high, the p channel MOSFETs 105 and 107 and the n channel MOSFET 109 are turned off, the n channel MOSFETs 106 and 108 are turned on, the voltage of the capacitor for generating negative voltage 104 is applied as a negative voltage between the gate and the source of the low side MOSFET 103, and the low side MOSFET 103 is turned off.

When the low side MOSFET 103 is switched from the ON state to the OFF state, a return current flows through a body diode of the low side MOSFET 103. When the period in which both the low side MOSFET 103 and the high side MOSFET 102 are in an OFF state (dead time) has passed, the high side MOSFET 102 begins to be turned on.

When the high side MOSFET 102 begins to be turned on, a drain-source voltage of the low side MOSFET 103 begins to increase. As described above, when the drain-source voltage of the low side MOSFET 103 begins to increase, the gate-source voltage of the low side MOSFET 103 also begins to increase in synchronization with the increase of the drain-source voltage.

However, in the present embodiment, the negative voltage is applied between the gate and the source of the low side MOSFET 103 in the OFF period of the low side MOSFET 103, and therefore, even when the gate-source voltage of the low side MOSFET 103 increases, the voltage does not reach the gate threshold voltage of the low side MOSFET 103. As a result, the self turn-on can be prevented.

Further, there is a fear that the voltage applied between the drain and the source of the low side MOSFET 103 drops in the ON period of the low side MOSFET 103 due to the charging to the capacitor for generating negative voltage 104. However, since the charging path of the capacitor for generating negative voltage 104 is provided separately from the charging path of input capacitance of the low side MOSFET 103, a drop of the voltage applied between the drain and the source of the low side MOSFET 103 does not occur in the ON period of the low side MOSFET 103.

By this means, the self turn-on described above can be prevented and the power efficiency can be improved. Further, since the voltage applied between the gate and the source does not drop from VD when the low side MOSFET 103 is ON, an increase in conduction loss can be prevented.

Furthermore, even when the gate threshold voltage of the low side MOSFET 103 is equal to or lower than 1 V, the self turn-on of the low side MOSFET 103 does not occur, and therefore, the conduction loss can be reduced by designing the gate threshold voltage of the low side MOSFET 103 to be equal to or lower than 1 V, and further improvement in the power efficiency can be achieved.

Note that, although an example in which the p channel MOSFETs 105, 107 and 111 and the n channel MOSFETs 106, 108, 109 and 112 are used as switches has been shown in FIG. 1, bipolar junction transistors and other switching elements may be used for these switches. Further, a Schottky barrier diode, a pn junction diode and others can be used for the diode 110 and the boot diode 113 shown in FIG. 1.

Second Embodiment

Figure 7:
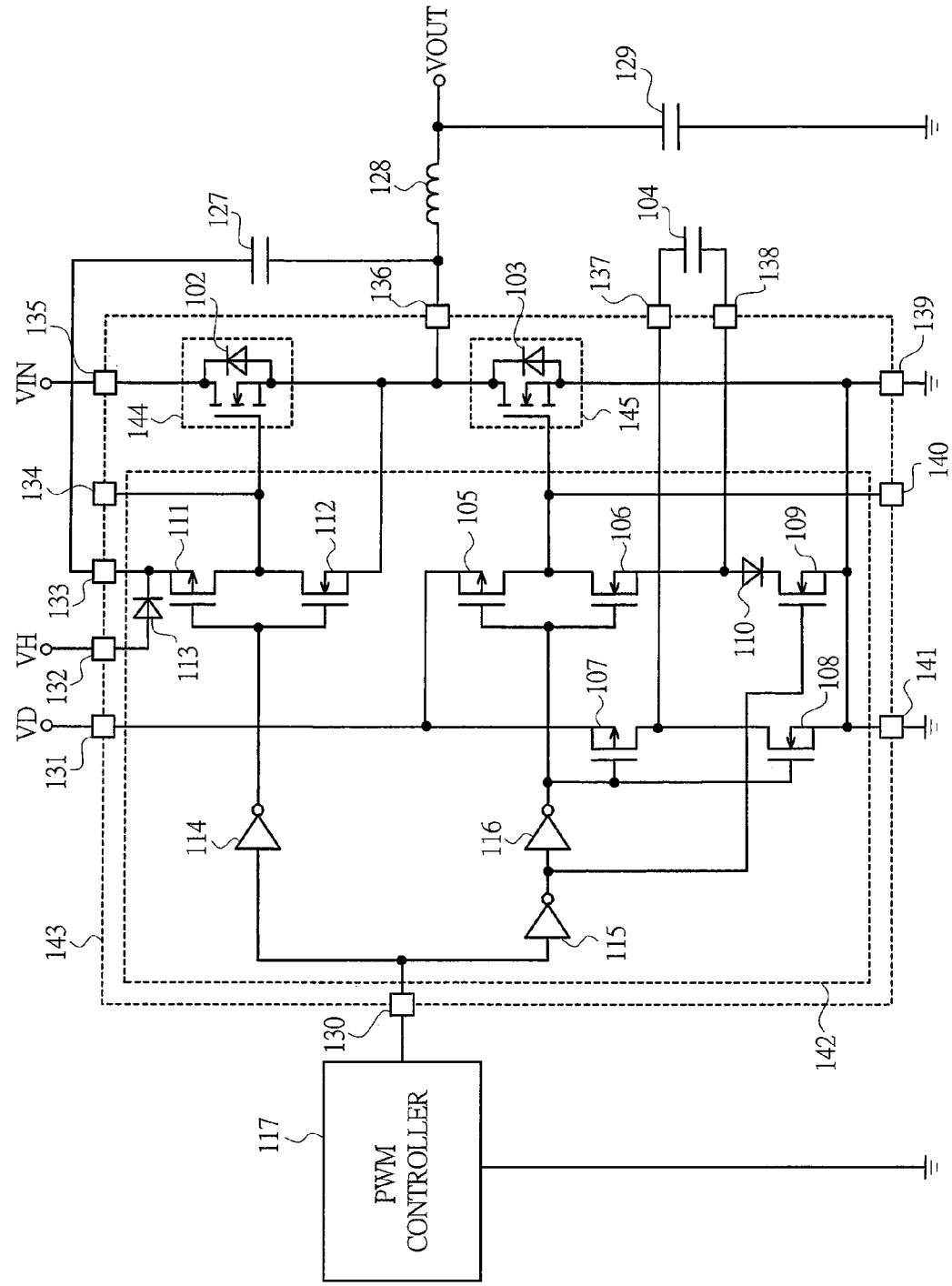
FIG. 7 is a diagram showing an example of a circuit configuration of a system in package of a DC-DC converter according to a second embodiment of the present invention.
Figure 8:
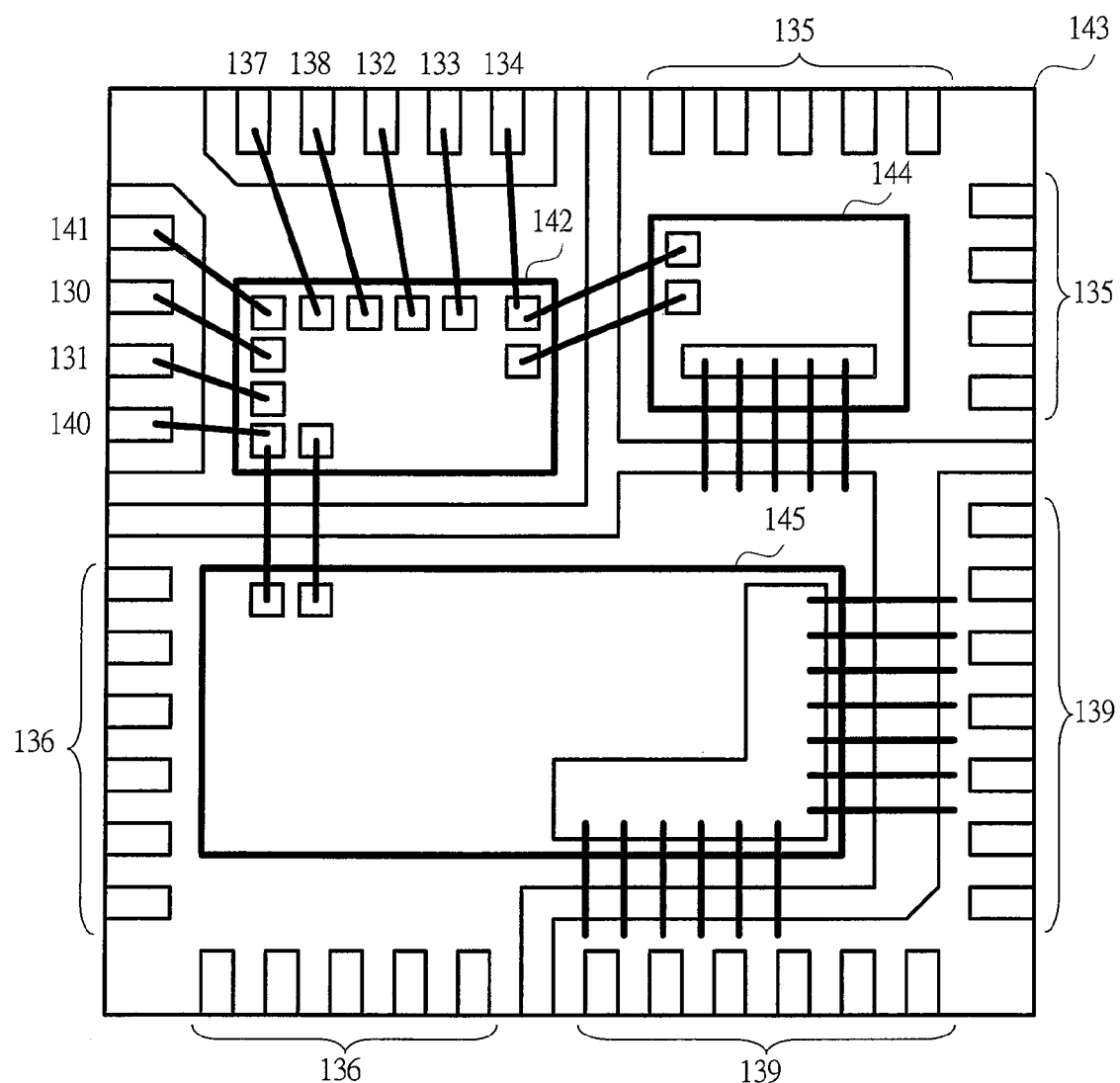
FIG. 8 is a diagram showing an example of a chip layout and a wire bonding layout of the system in package of the DC-DC converter according to the second embodiment of the present invention.

A system in package of a DC-DC converter according to a second embodiment of the present invention will be described with reference to FIG. 7 and FIG. 8. FIG. 7 is a diagram showing an example of a circuit configuration of the system in package of the DC-DC converter according to the second embodiment of the present invention. FIG. 8 is a diagram showing an example of a chip layout and a wire bonding layout of the system in package of the DC-DC converter according to the second embodiment of the present invention.

In FIG. 7, in the system in package of the DC-DC converter, a semiconductor chip 142 that is one of the components of a system in package 143 having terminals 131-141 has the same configuration as that of the gate driving unit 100 of the DC-DC converter of the first embodiment shown in FIG. 1 described above.

More specifically, the system in package 143 of the second embodiment comprises a semiconductor chip 144 of the high side MOSFET 102, a semiconductor chip 145 of the low side MOSFET 103, and the semiconductor chip 142 of the gate driving unit 100 that has a function to drive the high side MOSFET 102 and the low side MOSFET 103 and apply a negative voltage between the gate and the source of the low side MOSFET 103.

Also, the capacitor for generating negative voltage 104 and the boot capacitor 127 that constitute the gate driver 101 of the first embodiment shown in FIG. 1 are connected to the outside of the system in package 143.

In FIG. 8, terminals 137 and 138 for connecting the capacitor for generating negative voltage 104 to the system in package 143 are provided, and the system in package 143 is characterized in that the components thereof include the semiconductor chip 142 of the gate driving unit 100 of the first embodiment shown in FIG. 1 described above.

In the present embodiment, similarly to the first embodiment, the self turn-on can be prevented even in the system in package. Furthermore, since the system in package can reduce the parasitic inductance of the wiring, the further efficiency improvement can be achieved.

Third Embodiment

Figure 9:
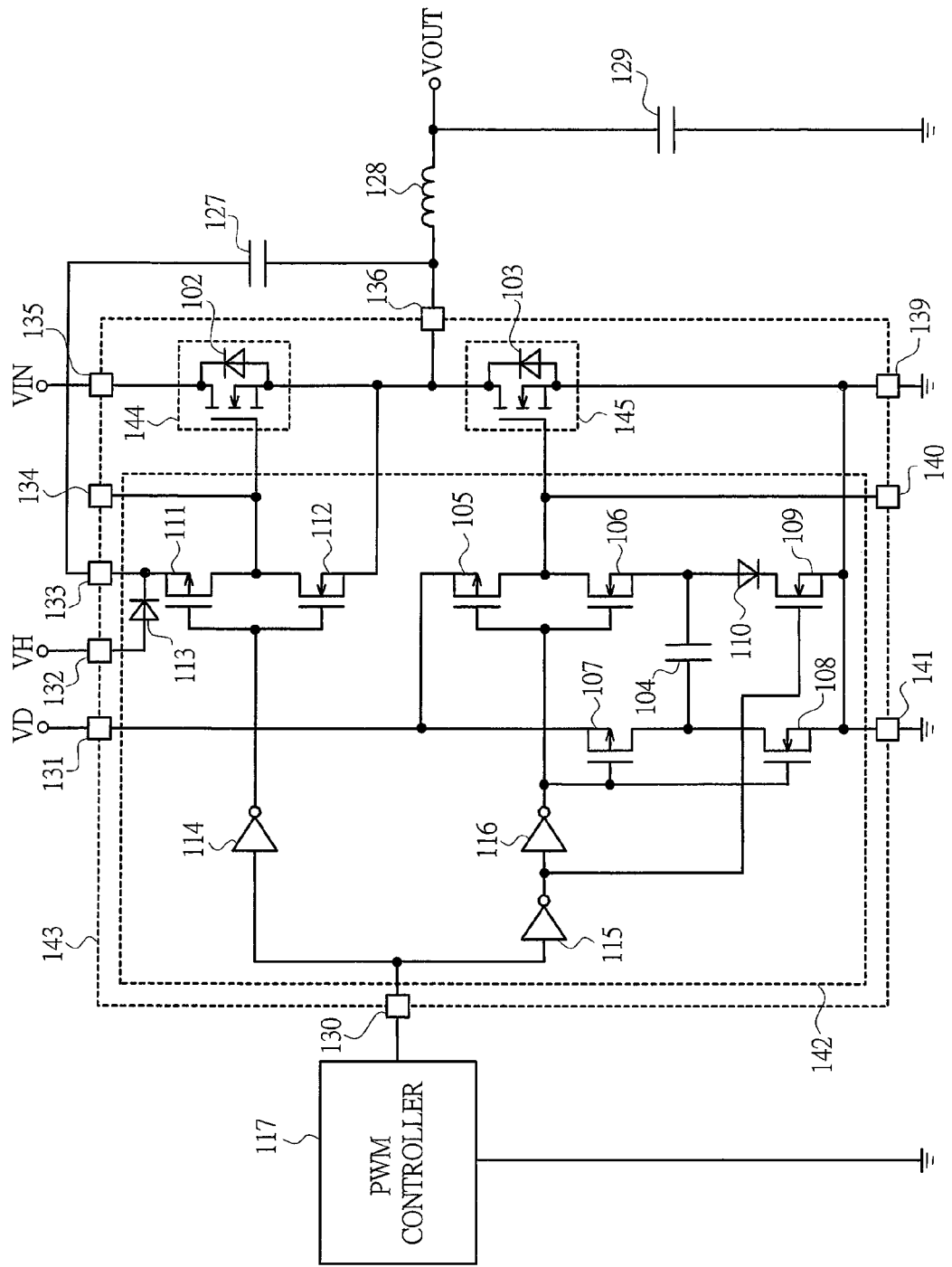
FIG. 9 is a diagram showing an example of a circuit configuration of a system in package of a DC-DC converter according to a third embodiment of the present invention.
Figure 10:
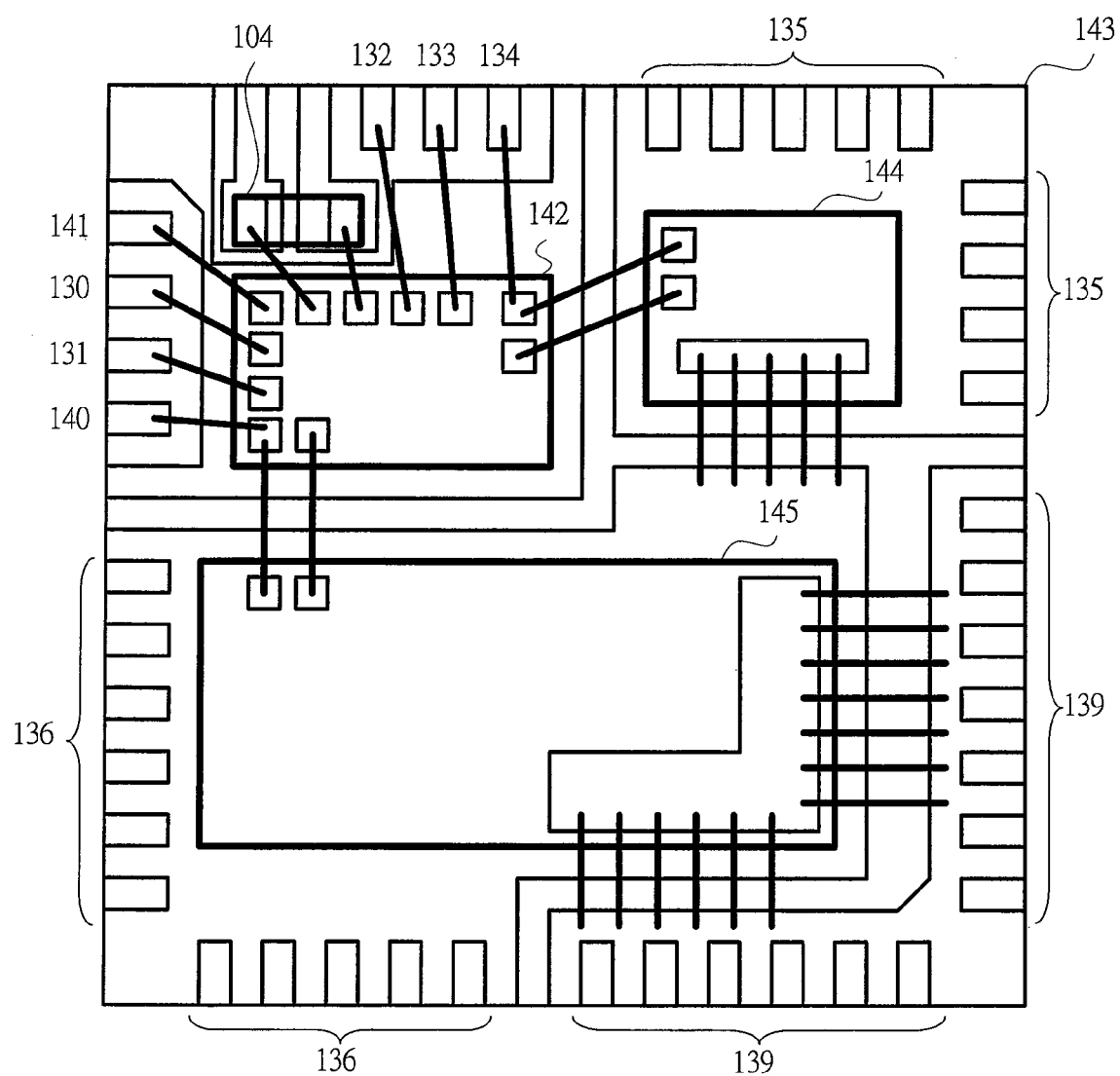
FIG. 10 is a diagram showing an example of a chip layout and a wire bonding layout of the system in package of the DC-DC converter according to the third embodiment of the present invention.

A system in package of a DC-DC converter according to a third embodiment of the present invention will be described with reference to FIG. 9 and FIG. 10. FIG. 9 is a diagram showing an example of a circuit configuration of the system in package of the DC-DC converter according to the third embodiment of the present invention. FIG. 10 is a diagram showing an example of a chip layout and a wire bonding layout of the system in package of the DC-DC converter according to the third embodiment of the present invention.

In FIG. 9, the characteristic of the system in package of the DC-DC converter of the present embodiment lies in that the capacitor for generating negative voltage 104 is incorporated in the system in package of the second embodiment shown in FIG. 7 described above.

More specifically, the system in package 143 of the third embodiment comprises the semiconductor chip 144 of the high side MOSFET 102, the semiconductor chip 145 of the low side MOSFET 103, the semiconductor chip 142 of the gate driver that has the function to drive the high side MOSFET 102 and the low side MOSFET 103 and apply a negative voltage between the gate and the source of the low side MOSFET 103, and the capacitor for generating negative voltage 104.

In FIG. 10, the characteristic of the system in package of the present embodiment lies in that the capacitor for generating negative voltage 104 is incorporated in the system in package 143.

In the present embodiment, since the wiring inductance between the semiconductor chip 142 of the gate driver and the capacitor for generating negative voltage 104 is lowered, the driving ability can be improved. Further, since no capacitor for generating negative voltage is necessary other than that in the system in package, the number of components of the power supply system can be reduced.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, the embodiments described above can be applied to a multi-chip module in which a high side MOSFET and a low side MOSFET are mounted in the same package.

The present invention is effective to improve the power efficiency in the power supply system for the CPU. Specifically, the present invention is preferably applied to a non-isolated DC-DC converter, a multi-chip module, and a system in package.

What is claimed is:

1. A non-insulated DC-DC converter comprising: a choke coil; an output capacitor connected between one end of the choke coil and a negative terminal of a DC input power source; a high side MOSFET whose drain terminal is connected to a positive terminal of the DC input power source and whose source terminal is connected to the other end of the choke coil; a low side MOSFET whose drain terminal is connected to the other end of the choke coil and whose source terminal is connected to the negative terminal of the DC input power source; and a gate driver controlled in accordance with a pulse signal and alternately driving the high side MOSFET and the low side MOSFET, wherein a part of the gate driver, the part driving the low side MOSFET, includes:

a gate driving DC power source whose negative terminal is connected to the source terminal of the low side MOSFET;

a capacitor for generating negative voltage;

a first switching element connected between a positive terminal of the gate driving DC power source and a gate terminal of the low side MOSFET;

a second switching element connected between the positive terminal of the gate driving DC power source and one end of the capacitor for generating negative voltage;

a third switching element connected between the gate terminal of the low side MOSFET and the other end of the capacitor for generating negative voltage;

a fourth switching element connected between the one end of the capacitor for generating negative voltage and the source terminal of the low side MOSFET; and a fifth switching element connected between the other end of the capacitor for generating negative voltage and the source terminal of the low side MOSFET.

2. The DC-DC converter according to claim 1, wherein, in synchronization with the pulse signal, in a first state, the gate driver controls the first switching element, the second switching element and the fifth switching element to be in a conduction state and controls the third switching element and the fourth switching element to be in a non-conduction state, and in a second state, the gate driver controls the first switching element, the second switching element and the fifth switching element to be in a non-conduction state and controls the third switching element and the fourth switching element to be in a conduction state.

3. The DC-DC converter according to claim 2, wherein the third switching element, the fourth switching element and the fifth switching element are n channel MOSFETs, the first switching element and the second switching element are p channel MOSFETs, and a diode is connected to the fifth switching element in series.

4. The DC-DC converter according to claim 2, wherein a gate threshold voltage of the low side MOSFET is equal to or lower than 1 V.

5. A driver IC to which a capacitor for generating negative voltage and a gate driving DC power source are connected and which is controlled in accordance with a pulse signal and alternately drives a high side MOSFET and a low side MOSFET, wherein a first switching element connected between a positive terminal of the gate driving DC power source and a gate terminal of the low side MOSFET;

a second switching element connected between the positive terminal of the gate driving DC power source and one end of the capacitor for generating negative voltage;

a third switching element connected between the gate terminal of the low side MOSFET and the other end of the capacitor for generating negative voltage;

a fourth switching element connected between the one end of the capacitor for generating negative voltage and a source terminal of the low side MOSFET;

a fifth switching element connected between the other end of the capacitor for generating negative voltage and the source terminal of the low side MOSFET; and a diode connected to the fifth switching element in series are formed on the same chip.

6. A system in package in which a high side MOSFET, a low side MOSFET and a driver IC which alternately drives the high side MOSFET and the low side MOSFET are mounted in the same package, wherein a first switching element connected between a positive terminal of a gate driving DC power source connected to the system in package and a gate terminal of the low side MOSFET;

a second switching element connected between the positive terminal of the gate driving DC power source and one end of a capacitor for generating negative voltage connected to the system in package;

a third switching element connected between the gate terminal of the low side MOSFET and the other end of the capacitor for generating negative voltage;

a fourth switching element connected between the one end of the capacitor for generating negative voltage and a source terminal of the low side MOSFET;

a fifth switching element connected between the other end of the capacitor for generating negative voltage and the source terminal of the low side MOSFET; and a diode connected to the fifth switching element in series are formed on the same chip of the driver IC.

7. The system in package according to claim 6, wherein the capacitor for generating negative voltage is incorporated.

* * * * *